United States Patent
Wada et al.

(10) Patent No.: US 10,697,086 B2
(45) Date of Patent: Jun. 30, 2020

(54) METHOD FOR MANUFACTURING SILICON CARBIDE EPITAXIAL SUBSTRATE, METHOD FOR MANUFACTURING SILICON CARBIDE SEMICONDUCTOR DEVICE, AND APPARATUS FOR MANUFACTURING SILICON CARBIDE EPITAXIAL SUBSTRATE

(71) Applicant: Sumitomo Electric Industries, Ltd., Osaka-shi (JP)

(72) Inventors: Keiji Wada, Itami (JP); Hideyuki Doi, Itami (JP); Hironori Itoh, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 113 days.

(21) Appl. No.: 15/752,985

(22) PCT Filed: Aug. 2, 2016

(86) PCT No.: PCT/JP2016/072625
§ 371 (c)(1),
(2) Date: Feb. 15, 2018

(87) PCT Pub. No.: WO2017/056691
PCT Pub. Date: Apr. 6, 2017

(65) Prior Publication Data
US 2018/0237942 A1   Aug. 23, 2018

(30) Foreign Application Priority Data

Sep. 29, 2015 (JP) .................... 2015-191489

(51) Int. Cl.
*C30B 25/04* (2006.01)
*C30B 25/08* (2006.01)
(Continued)

(52) U.S. Cl.
CPC ............ *C30B 25/08* (2013.01); *C30B 25/165* (2013.01); *C30B 29/36* (2013.01);
(Continued)

(58) Field of Classification Search
CPC .......... C30B 25/02; C30B 25/04; C30B 25/14
See application file for complete search history.

(56) References Cited

U.S. PATENT DOCUMENTS

| 7,377,977 B2 * | 5/2008 | Motakef ............... C23C 16/303 |
| | | 117/200 |
| 2001/0012678 A1 * | 8/2001 | Tanaka ................ H01L 21/0262 |
| | | 438/481 |

(Continued)

FOREIGN PATENT DOCUMENTS

JP      2014-170891 A    9/2014

*Primary Examiner* — Robert M Kunemund
(74) *Attorney, Agent, or Firm* — Baker Botts L.L.P.; Michael A. Sartori

(57) ABSTRACT

In forming of a silicon carbide layer, when an X axis indicates a first value representing, in percentage, a value obtained by dividing a flow rate of silane by a flow rate of hydrogen and a Y axis indicates a second value representing a flow rate of ammonia in sccm, the first value and the second value fall within a quadrangular region surrounded by first coordinates, second coordinates, third coordinates, and fourth coordinates in XY plane coordinates. The first coordinates are $(0.05, 6.5 \times 10^{-4})$. The second coordinates are $(0.05, 4.5 \times 10^{-3})$. The third coordinates are $(0.22, 1.2 \times 10^{-2})$. The fourth coordinates are $(0.22, 1.3 \times 10^{-1})$. After the forming of the silicon carbide layer, an average value of carrier concentration of the silicon carbide layer is more than or equal to $1 \times 10^{15}$ cm$^{-3}$ and less than or equal to $2 \times 10^{16}$ cm$^{-3}$.

4 Claims, 6 Drawing Sheets

(51) Int. Cl.
*H01L 21/02* (2006.01)
*H01L 29/66* (2006.01)
*C30B 29/36* (2006.01)
*H01L 29/78* (2006.01)
*C30B 25/16* (2006.01)
*H01L 21/205* (2006.01)
*H01L 29/16* (2006.01)

(52) U.S. Cl.
CPC .... *H01L 21/0262* (2013.01); *H01L 21/02378* (2013.01); *H01L 21/02433* (2013.01); *H01L 21/02529* (2013.01); *H01L 21/2053* (2013.01); *H01L 29/1608* (2013.01); *H01L 29/66068* (2013.01); *H01L 29/7802* (2013.01)

(56) References Cited

U.S. PATENT DOCUMENTS

| | | | |
|---|---|---|---|
| 2014/0252376 A1* | 9/2014 | Itoh | H01L 29/1608 257/77 |
| 2014/0287539 A1* | 9/2014 | Ito | C23C 16/4408 438/5 |

* cited by examiner

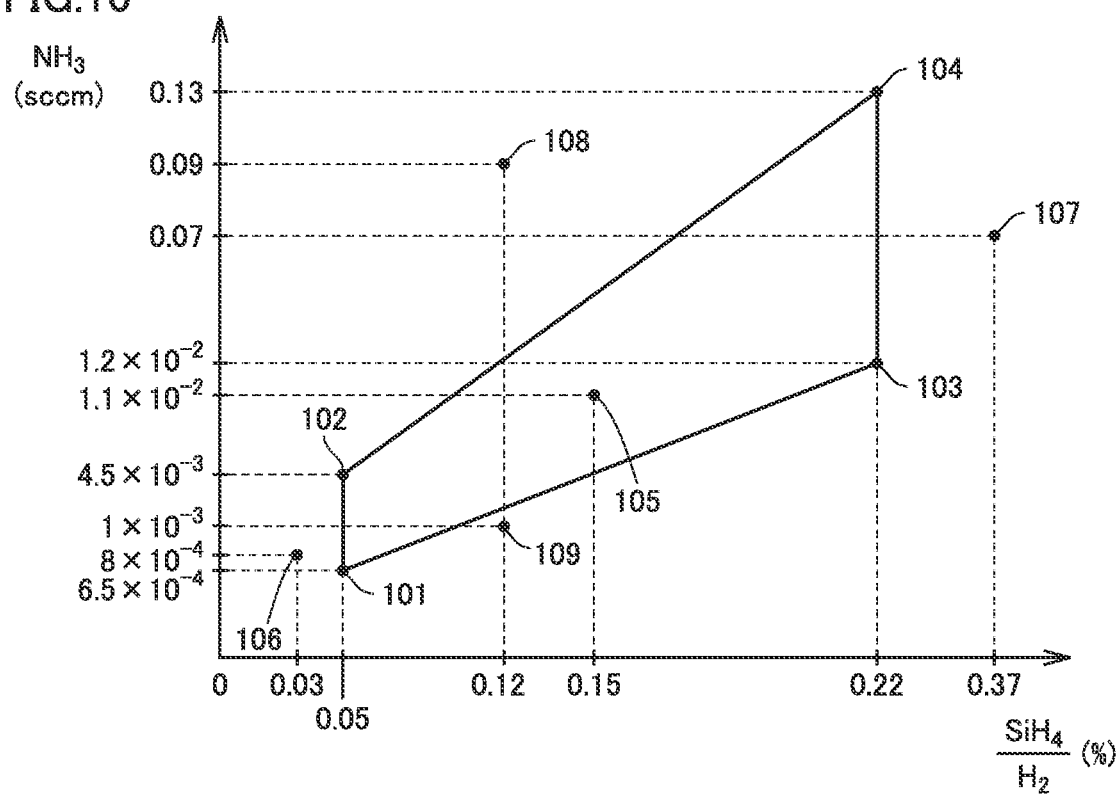

METHOD FOR MANUFACTURING SILICON CARBIDE EPITAXIAL SUBSTRATE, METHOD FOR MANUFACTURING SILICON CARBIDE SEMICONDUCTOR DEVICE, AND APPARATUS FOR MANUFACTURING SILICON CARBIDE EPITAXIAL SUBSTRATE

TECHNICAL FIELD

The present disclosure relates to a method for manufacturing a silicon carbide epitaxial substrate, a method for manufacturing a silicon carbide semiconductor device, and an apparatus for manufacturing the silicon carbide epitaxial substrate. The present application claims a priority based on Japanese Patent Application No. 2015-191489 filed on Sep. 29, 2015, the entire content of which is incorporated herein by reference.

BACKGROUND ART

Japanese Patent Laying-Open No. 2014-170891 (Patent Document 1) discloses a method for epitaxially growing a silicon carbide layer on a silicon carbide single crystal substrate.

CITATION LIST

Patent Document

PTD 1: Japanese Patent Laying-Open No. 2014-170891

SUMMARY OF INVENTION

A method for manufacturing a silicon carbide epitaxial substrate according to the present disclosure includes the following steps. A silicon carbide single crystal substrate is placed in a reaction chamber. A silicon carbide layer is formed on the silicon carbide single crystal substrate by supplying the reaction chamber with a mixed gas including silane, ammonia, and hydrogen. The silicon carbide single crystal substrate has a maximum diameter of more than or equal to 100 mm. In the forming of the silicon carbide layer, when an X axis indicates a first value representing, in percentage, a value obtained by dividing a flow rate of the silane by a flow rate of the hydrogen and a Y axis indicates a second value representing a flow rate of the ammonia in sccm, the first value and the second value fall within a quadrangular region surrounded by first coordinates, second coordinates, third coordinates, and fourth coordinates in XY plane coordinates. The first coordinates are $(0.05, 6.5 \times 10^{-4})$. The second coordinates are $(0.05, 4.5 \times 10^{-3})$. The third coordinates are $(0.22, 1.2 \times 10^{-2})$. The fourth coordinates are $(0.22, 1.3 \times 10^{-1})$. After the forming of silicon carbide layer 20, an average value of carrier concentration of silicon carbide layer 20 is more than or equal to $1 \times 10^{15}$ cm$^{-3}$ and less than or equal to $2 \times 10^{16}$ cm$^{-3}$.

An apparatus for manufacturing a silicon carbide epitaxial substrate according to the present disclosure includes a reaction chamber, a gas supplier, and a controller. The reaction chamber is configured to be capable of heating a silicon carbide single crystal substrate. The gas supplier is configured to be capable of supplying the reaction chamber with a mixed gas including silane, ammonia, and hydrogen. The controller is configured to be capable of controlling a flow rate of the mixed gas supplied from the gas supplier to the reaction chamber. The controller is configured to be capable of controlling a flow rate of the silane, a flow rate of the ammonia, and a flow rate of the hydrogen such that when an X axis indicates a first value representing, in percentage, a value obtained by dividing the flow rate of the silane by the flow rate of the hydrogen and a Y axis indicates a second value representing the flow rate of the ammonia in sccm, the first value and the second value fall within a quadrangular region surrounded by first coordinates, second coordinates, third coordinates, and fourth coordinates in XY plane coordinates. The first coordinates are $(0.05, 6.5 \times 10^{-4})$. The second coordinates are $(0.05, 4.5 \times 10^{-3})$. The third coordinates are $(0.22, 1.2 \times 10^{-2})$. The fourth coordinates are $(0.22, 1.3 \times 10^{-1})$.

BRIEF DESCRIPTION OF DRAWINGS

FIG. 10 shows a relation between SiH$_4$ flow rate/H$_2$ flow rate (%) and NH$_3$ flow rate (sccm) in a method for manufacturing a silicon carbide epitaxial substrate according to each of evaluation samples.

DESCRIPTION OF EMBODIMENTS

Figure 1:
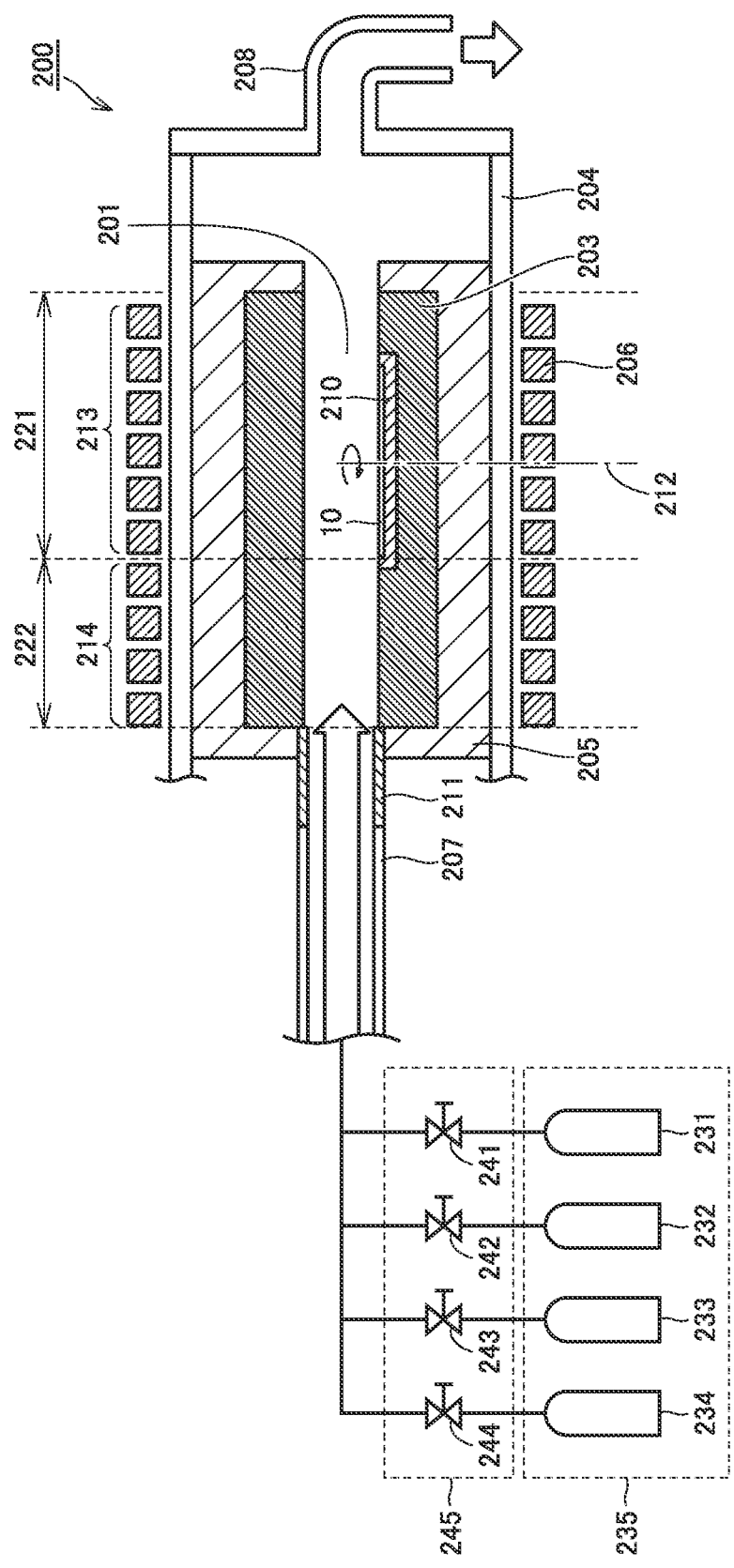
FIG. 1 is a partial schematic cross sectional view showing a configuration of a manufacturing apparatus for a silicon carbide epitaxial substrate according to the present embodiment.

Overview of Embodiments of the Present Disclosure

Embodiments of the present disclosure will be described first. In the description below, the same or corresponding elements are given the same reference characters and are not described repeatedly. Regarding crystallographic indications in the present specification, an individual orientation is represented by [ ], a group orientation is represented by < >, and an individual plane is represented by ( ), and a group plane is represented by { }. A crystallographically negative index is normally expressed by putting "-" (bar) above a numeral; however, in the present specification, the crystallographically negative index is expressed by putting a negative sign before the numeral.

(1) A method for manufacturing a silicon carbide epitaxial substrate 100 according to the present disclosure includes the following steps. A silicon carbide single crystal substrate 10 is placed in a reaction chamber 201. A silicon carbide layer 20 is formed on silicon carbide single crystal substrate 10 by supplying reaction chamber 201 with a mixed gas including silane, ammonia, and hydrogen. Silicon carbide single crystal substrate 10 has a maximum diameter of more than or equal to 100 mm. In the forming of the silicon carbide layer, when an X axis indicates a first value representing, in percentage, a value obtained by dividing a flow rate of the silane by a flow rate of the hydrogen and a Y axis indicates a second value representing a flow rate of the ammonia in sccm, the first value and the second value fall within a quadrangular region surrounded by first coordinates, second coordinates, third coordinates, and fourth coordinates in XY plane coordinates. The first coordinates are $(0.05, 6.5 \times 10^{-4})$. The second coordinates are $(0.05, 4.5 \times 10^{-3})$. The third coordinates are $(0.22, 1.2 \times 10^{-2})$. The fourth coordinates are $(0.22, 1.3 \times 10^{-1})$. After the forming of silicon carbide layer 20, an average value of carrier concentration of silicon carbide layer 20 is more than or equal to $1 \times 10^{15}$ cm$^{-3}$ and less than or equal to $2 \times 10^{16}$ cm$^{-3}$. It should be noted that the unit of the flow rate, "sccm (standard cc/minute)", indicates a flow rate "cc/minute" under standard conditions (0° C., 101.3 kPa).

A silicon carbide epitaxial substrate used to manufacture a silicon carbide semiconductor device has been required to achieve excellent in-plane uniformity of carrier concentration and excellent flatness of a surface of a silicon carbide layer while maintaining an average carrier concentration to fall within a certain range required in silicon carbide semiconductor devices. In recent years, in addition to the achievement of the above-described characteristics, a silicon carbide layer has been required to be grown at a high rate.

However, if the growth rate of the silicon carbide layer is simply increased, the flatness of a surface of the silicon carbide layer may be deteriorated. Moreover, for maintaining the excellent flatness of the surface of the silicon carbide layer, the average carrier concentration of the silicon carbide layer may fall out of the range required in power devices. In other words, it was very difficult to achieve the high-rate growth of the silicon carbide layer, the excellent flatness of the surface of the silicon carbide layer, and the excellent in-plane uniformity of the carrier concentration while maintaining the average carrier concentration of the silicon carbide layer to fall within the certain range required in silicon carbide semiconductor devices. As a result of diligent study, the inventors have obtained the following knowledge with regard to a method for manufacturing a silicon carbide epitaxial substrate satisfying the above-described requirement, and found one embodiment of the present disclosure.

Specifically, it has been found that the silicon carbide epitaxial substrate satisfying the above-described requirement can be realized by: using silane as a source material gas, using hydrogen as a carrier gas, and using ammonia as a dopant gas; and controlling a silane flow rate/hydrogen flow and an ammonia flow rate to fall within a certain range. Specifically, when an X axis indicates a first value representing, in percentage, a value obtained by dividing the flow rate of the silane by the flow rate of the hydrogen and a Y axis indicates a second value representing the flow rate of the ammonia in sccm, the flow rate of the silane, the flow rate of the hydrogen, and the flow rate of the ammonia are controlled such that the first value and the second value fall within a quadrangular region surrounded by the first coordinates, the second coordinates, the third coordinates, and the fourth coordinates in the XY plane coordinates. Accordingly, the high-rate growth of the silicon carbide layer can be achieved while improving the flatness of the surface of the silicon carbide layer and the in-plane uniformity of the carrier concentration.

(2) In the method for manufacturing silicon carbide epitaxial substrate 100 according to (1), reaction chamber 201 may include a first heating region 213 above silicon carbide single crystal substrate 10 and a second heating region 214 located upstream of first heating region 213. In the forming of silicon carbide layer 20, second heating region 214 may have a temperature more than or equal to a decomposition temperature of the ammonia. Accordingly, the ammonia can be thermally decomposed at the upstream of the silicon carbide single crystal substrate, whereby the in-plane uniformity of the carrier concentration can be improved.

(3) In the method for manufacturing silicon carbide epitaxial substrate 100 according to (2), second heating region 214 has a length of more than or equal to 60 mm in a flow direction of the mixed gas. Accordingly, the ammonia can be thermally decomposed in a wide region, whereby the in-plane uniformity of the carrier concentration can be improved.

(4) A method for manufacturing a silicon carbide semiconductor device 300 according to the present disclosure includes the following steps. The silicon carbide epitaxial substrate manufactured by the method recited in any one of (1) to (3) is prepared. The silicon carbide epitaxial substrate is processed.

(5) An apparatus 200 for manufacturing a silicon carbide epitaxial substrate 100 according to the present disclosure includes a reaction chamber 201, a gas supplier 235, and a controller 245. Reaction chamber 201 is configured to be capable of heating a silicon carbide single crystal substrate 10. Gas supplier 235 is configured to be capable of supplying reaction chamber 201 with a mixed gas including silane, ammonia, and hydrogen. Controller 245 is configured to be capable of controlling a flow rate of the mixed gas supplied from gas supplier 235 to reaction chamber 201. Controller 245 is configured to be capable of controlling a flow rate of the silane, a flow rate of the ammonia, and a flow rate of the hydrogen such that when an X axis indicates a first value representing, in percentage, a value obtained by dividing the flow rate of the silane by the flow rate of the hydrogen and a Y axis indicates a second value representing the flow rate of the ammonia in sccm, the first value and the second value fall within a quadrangular region surrounded by first coordinates, second coordinates, third coordinates, and fourth coordinates in XY plane coordinates. The first coordinates are $(0.05, 6.5 \times 10^{-4})$. The second coordinates are $(0.05, 4.5 \times 10^{-3})$. The third coordinates are $(0.22, 1.2 \times 10^{-2})$. The fourth coordinates are $(0.22, 1.3 \times 10^{-1})$. Accordingly, the high-rate growth of the silicon carbide layer, the excellent flatness of the surface of the silicon carbide layer, and the excellent in-plane uniformity of the carrier concentration can be achieved while maintaining the average carrier concentration of the silicon carbide layer to be more than or equal to $1 \times 10^{15}$ cm$^{-3}$ and less than or equal to $2 \times 10^{16}$ cm$^{-3}$.

(6) In apparatus 200 for manufacturing silicon carbide epitaxial substrate 100 according to (5), reaction chamber 201 may include a first heating region 213 above a region in which silicon carbide single crystal substrate 10 is placed and a second heating region 214 located upstream of first heating region 213. Second heating region 214 may be configured to be able to be heated to a temperature more than or equal to a decomposition temperature of the ammonia. Accordingly, the ammonia can be thermally decomposed at the upstream of the silicon carbide single crystal substrate, whereby the in-plane uniformity of the carrier concentration can be improved.

(7) In apparatus 200 for manufacturing silicon carbide epitaxial substrate 100 according to (6), second heating region 214 may have a length of more than or equal to 60 mm in a flow direction of the mixed gas. Accordingly, the ammonia can be thermally decomposed in a wide region, whereby the in-plane uniformity of the carrier concentration can be improved.

Details of Embodiments of the Present Disclosure

The following describes one embodiment (hereinafter, referred to as "the present embodiment") of the present disclosure. However, the present embodiment is not limited to these.

(Manufacturing Apparatus for Silicon Carbide Epitaxial Substrate)

The following describes a configuration of a manufacturing apparatus 200 for a silicon carbide epitaxial substrate 100 according to the present embodiment.

As shown in FIG. 1, manufacturing apparatus 200 is a hot wall type lateral CVD (Chemical Vapor Deposition) apparatus, for example. Manufacturing apparatus 200 mainly includes a reaction chamber 201, a gas supplier 235, a controller 245, a heating element 203, a quartz tube 204, a heat insulator 205, and an induction heating coil 206.

Heating element 203 has a cylindrical shape, for example. Reaction chamber 201 is formed inside heating element 203. Heating element 203 is composed of graphite, for example. Heat insulator 205 surrounds an outer circumference of heating element 203. Heat insulator 205 is provided inside quartz tube 204 in contact with an inner circumferential surface of quartz tube 204. Induction heating coil 206 is wound along the outer circumference surface of quartz tube 204, for example. Induction heating coil 206 is configured to be able to be supplied with alternating current by an external power supply (not shown). Accordingly, heating element 203 is inductively heated. As a result, reaction chamber 201 is heated by heating element 203.

Reaction chamber 201 is a space surrounded by heating element 203. In reaction chamber 201, silicon carbide single crystal substrate 10 is placed. Reaction chamber 201 is configured to be capable of heating silicon carbide single crystal substrate 10. The silicon carbide single crystal substrate has a maximum diameter of more than or equal to 100 mm. Reaction chamber 201 is provided with a susceptor plate 210 that holds silicon carbide single crystal substrate 10. Susceptor plate 210 is configured to be rotatable around a rotation axis 212.

Manufacturing apparatus 200 further includes a gas inlet 207 and a gas outlet 208. Gas outlet 208 is connected to a vacuum pump (not shown). Arrows in FIG. 1 indicate flow of gas. The gas is introduced from gas inlet 207 to reaction chamber 201, and is exhausted from gas outlet 208. A pressure in reaction chamber 201 is adjusted in accordance with a balance between an amount of the supplied gas and an amount of the exhausted gas.

Manufacturing apparatus 200 may further include a heater 211 located between gas inlet 207 and heating element 203. Heater 211 is located upstream of heating element 203. Heating element 203 may be configured to be heated up to about 1100° C. to 1350° C., for example.

Gas supplier 235 is configured to be capable of supplying reaction chamber 201 with a mixed gas including silane, ammonia, and gas including hydrogen and carbon atoms. Specifically, gas supplier 235 may include a first gas supplier 231, a second gas supplier 232, a third gas supplier 233, and a carrier gas supplier 234.

First gas supplier 231 is configured to be capable of supplying a first gas including carbon atoms. First gas supplier 231 is a gas cylinder filled with the first gas, for example. The first gas is propane ($C_3H_8$) gas, for example. The first gas may be methane ($CH_4$) gas, ethane ($C_2H_6$) gas, acetylene ($C_2H_2$) gas, or the like, for example.

Second gas supplier 232 is configured to be capable of supplying the second gas including silane gas. Second gas supplier 232 is a gas cylinder filled with the second gas, for example. The second gas is silane ($SiH_4$) gas, for example. The second gas may be a mixed gas of silane gas and gas other than silane.

Third gas supplier 233 is configured to be capable of supplying a third gas including ammonia gas. Third gas supplier 233 is a gas cylinder filled with the third gas, for example. The third gas is a doping gas including N (nitrogen atoms). The ammonia gas is more likely to be thermally decomposed than nitrogen gas having a triple bond. By using the ammonia gas, in-plane uniformity of carrier concentration can be expected to be improved.

Carrier gas supplier 234 is configured to be capable of supplying a carrier gas such as hydrogen, for example. Carrier gas supplier 234 is a gas cylinder filled with hydrogen, for example.

Controller 245 is configured to be capable of controlling the flow rate of the mixed gas supplied from gas supplier 235 to reaction chamber 201. Specifically, controller 245 may include a first gas flow rate controller 241, a second gas flow rate controller 242, a third gas flow rate controller 243, and a carrier gas flow rate controller 244. Each of the controllers may be a MFC (Mass Flow Controller), for example. Controller 245 is disposed between gas supplier 235 and gas inlet 207. In other words, controller 245 is disposed in a flow path that connects between gas supplier 235 and gas inlet 207.

In manufacturing apparatus 200, reaction chamber 201 includes: a first heating region 213 above a region in which silicon carbide single crystal substrate 10 is placed; and a second heating region 214 located upstream of first heating region 213. As shown in FIG. 1, second heating region 214 is a region extending in the flow direction (axial direction of reaction chamber 201) of the mixed gas from an upstream boundary between heat insulator 205 and heating element 203 to an upstream end portion of the region at which silicon carbide single crystal substrate 10 is placed. The boundary portion between second heating region 214 and first heating region 213 may be an upstream side surface of a recess provided in susceptor plate 210. The downstream end portion of first heating region 213 may be a downstream boundary between heat insulator 205 and heating element 203.

In the axial direction of reaction chamber 201, a density of windings of induction heating coil 206 may be changed. The density of windings [the number of windings/m] is the number of windings of the coil per unit length in the axial direction of the apparatus. For example, in order to thermally decompose ammonia effectively at the upstream side, the density of windings of induction heating coil 206 at the upstream side may be higher than the density of windings of induction heating coil 206 at the downstream side in second heating region 214.

Second heating region 214 may be configured to be able to be heated to a temperature more than or equal to the decomposition temperature of the ammonia. The decomposition temperature of the ammonia is 500° C., for example. The temperature of second heating region 214 can be measured using a radiation thermometer, for example. The temperature of the portion of heating element 203 constituting second heating region 214 is 1580° C., for example. In the flow direction of the mixed gas, length 222 of second heating region 214 may be more than or equal to 60 mm, may be more than or equal to 70 mm, and may be more than or equal to 80 mm, and is preferably less than or equal to 100 mm. When length 222 is more than 100 mm, the ammonia is decomposed too much, with the result that the in-plane uniformity of the carrier concentration may be deteriorated. In the flow direction of the mixed gas, length 221 of first heating region 213 may be larger than length 222 of second heating region 214.

Figure 2:
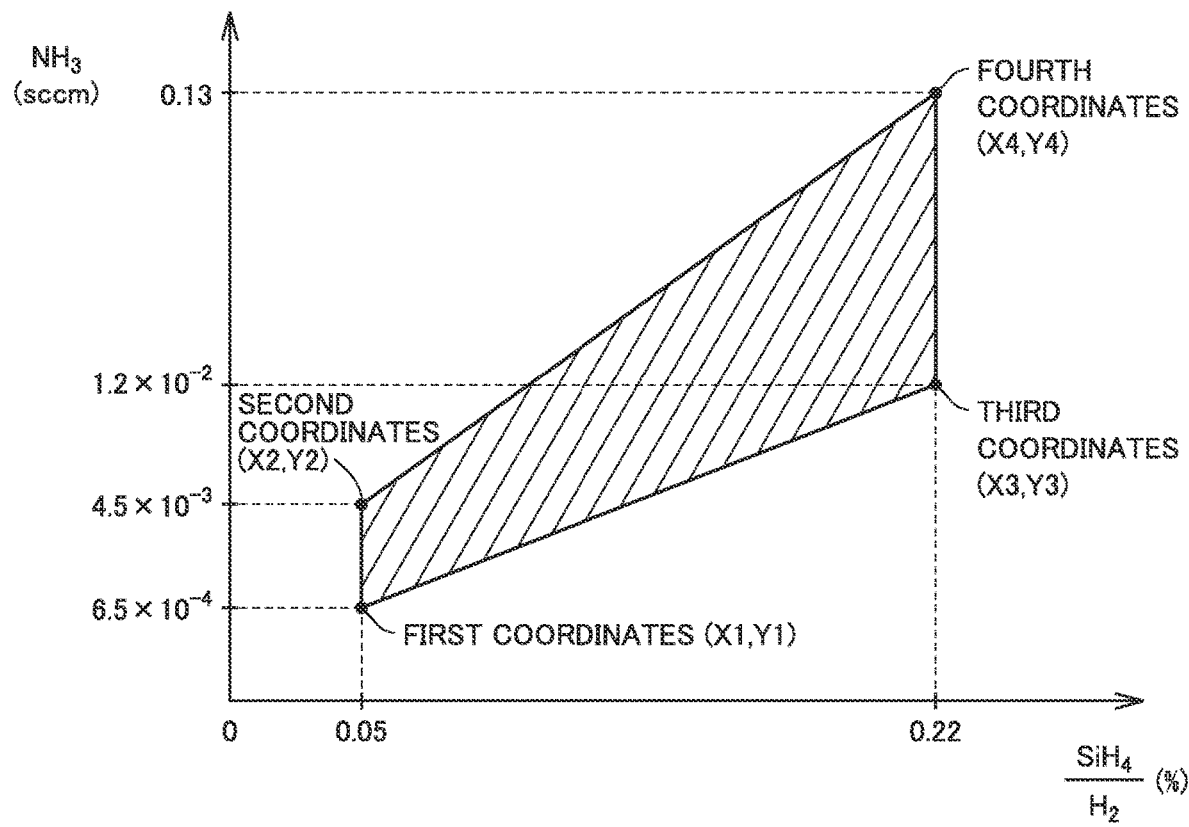
FIG. 2 shows a relation between SiH$_4$ flow rate/H$_2$ flow rate (%) and NH$_3$ flow rate (sccm) in a method for manufacturing the silicon carbide epitaxial substrate according to the present embodiment.

As shown in FIG. 2, the X axis indicates a value (first value) representing, in percentage, a value obtained by dividing the flow rate of the silane by the flow rate of the hydrogen, whereas the Y axis indicates a value (second value) representing the flow rate of the ammonia in sccm. Controller 245 is configured to be capable of controlling the flow rate of the silane, the flow rate of the ammonia, and the flow rate of the hydrogen such that the first value (%) and the second value (sccm) fall within a quadrangular region (region indicated by hatching in FIG. 2) surrounded by first coordinates, second coordinates, third coordinates, and fourth coordinates in XY plane coordinates. The first coordinates (X1, Y1) are $(0.05, 6.5 \times 10^{-4})$. The second coordinates (X2, Y2) are $(0.05, 4.5 \times 10^{-3})$. The third coordinates (X3, Y3) are $(0.22, 1.2 \times 10^{-2})$. The fourth coordinates (X4, Y4) are $(0.22, 1.3 \times 10^{-1})$.

Controller 245 includes a carrier gas flow rate controller 244, a second gas flow rate controller 242, and a third gas flow rate controller 243, for example. Carrier gas flow rate controller 244 is configured to be capable of controlling the flow rate of the carrier gas (hydrogen) to be 100 slm. Second gas flow rate controller 242 is configured to be capable of controlling the flow rate of the second gas (silane gas) to be 150 sccm. Third gas flow rate controller 243 is configured to be capable of controlling the flow rate of the third gas (ammonia gas) to be $1.1 \times 10^{-2}$ sccm. In this case, the value representing, in percentage, the value obtained by dividing the flow rate of the silane by the flow rate of the hydrogen is 0.15%. Therefore, the value (first value) indicating the value representing, in percentage, the value obtained by dividing the flow rate of the silane by the flow rate of the hydrogen and the value (second value) representing the flow rate of the ammonia in sccm fall within the region indicated by the hatching in FIG. 2.

(Method for Manufacturing Silicon Carbide Epitaxial Substrate)

Next, the following describes a method for manufacturing the silicon carbide epitaxial substrate according to the present embodiment.

Figure 3:
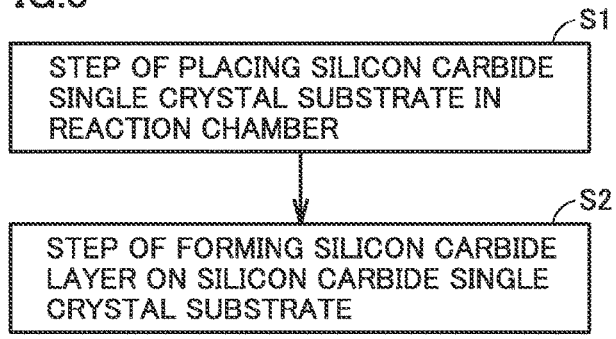
FIG. 3 is a flowchart schematically showing the method for manufacturing the silicon carbide epitaxial substrate according to the present embodiment.
Figure 4:
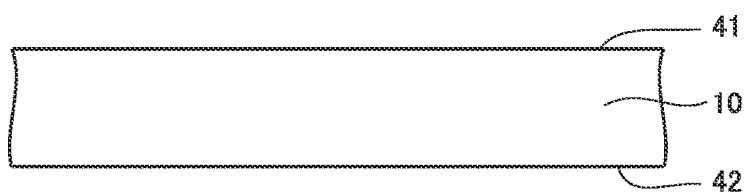
FIG. 4 is a schematic cross sectional view showing a first step of the method for manufacturing the silicon carbide epitaxial substrate according to the present embodiment.

First, a step (S1: FIG. 3) of placing the silicon carbide single crystal substrate in the reaction chamber is performed. For example, a silicon carbide single crystal having a polytype of 6H is manufactured by a sublimation method. Next, silicon carbide single crystal substrate 10 is prepared by slicing the silicon carbide single crystal using a wire saw, for example (see FIG. 4). Silicon carbide single crystal substrate 10 has a first main surface 41 and a second main surface 42 opposite to first main surface 41. The polytype of the silicon carbide single crystal is 4 H—SiC, for example. 4 H—SiC is more excellent than the other polytypes in terms of electron mobility, dielectric strength, and the like. Silicon carbide single crystal substrate 10 includes an n type impurity such as nitrogen, for example. The conductivity type of silicon carbide single crystal substrate 10 is n type, for example.

First main surface 41 is a {0001} plane or a plane inclined by an angle of less than or equal to 8° relative to the {0001} plane, for example. Specifically, first main surface 41 may be a (0001) plane or a plane inclined by an angle of less than or equal to 8° relative to the (0001) plane, or may be a (000-1) plane or a plane inclined by an angle of less than or equal to 8° relative to the (000-1) plane. When first main surface 41 is inclined relative to the {0001} plane, the inclination direction of a line normal to first main surface 41 is a <11-20> direction, for example. The inclination angle (off angle) relative to the {0001} plane may be more than or equal to 1° or may be more than or equal to 2°. The off angle may be less than or equal to 7°, may be less than or equal to 6°, or may be less than or equal to 4°.

The maximum diameter (diameter) of first main surface 41 of silicon carbide single crystal substrate 10 is more than or equal to 100 mm. The diameter may be more than or equal to 150 mm, may be more than or equal to 200 mm, or may be more than or equal to 250 mm. Although the upper limit of the diameter is not limited in particular, the upper limit of the diameter may be 300 mm, for example. Next, silicon carbide single crystal substrate 10 is placed in reaction chamber 201. As shown in FIG. 1, silicon carbide single crystal substrate 10 is placed on a recess of susceptor plate 210.

Next, a step (S2: FIG. 3) of forming a silicon carbide layer on the silicon carbide single crystal substrate is performed. Specifically, silicon carbide layer 20 is formed by epitaxial growth on silicon carbide single crystal substrate 10 using manufacturing apparatus 200 described above. For example, after the pressure of reaction chamber 201 is reduced from the atmospheric pressure to about $1 \times 10^{-6}$ Pa, the temperature of silicon carbide single crystal substrate 10 is started to be increased. During the increase of the temperature, hydrogen ($H_2$) gas serving as the carrier gas is introduced from carrier gas supplier 234 to reaction chamber 201. The flow rate of the hydrogen gas is adjusted by carrier gas flow rate controller 244.

After the temperature of silicon carbide single crystal substrate 10 reaches, for example, about 1600° C., reaction chamber 201 is supplied with source material gas, dopant gas and carrier gas. Specifically, reaction chamber 201 is supplied with a mixed gas including silane, ammonia, hydrogen, and propane, thereby thermally decomposing the gases. Accordingly, silicon carbide layer 20 is formed on silicon carbide single crystal substrate 10. A C/Si ratio of the mixed gas may be 1.0, for example.

As shown in FIG. 2, the X axis indicates a value (first value) representing, in percentage, a value obtained by dividing the flow rate of the silane by the flow rate of the hydrogen, whereas the Y axis indicates a value (second value) representing the flow rate of the ammonia in sccm. In the step of forming the silicon carbide layer, the first value and the second value fall within the quadrangular region (region indicated by hatching in FIG. 2) surrounded by the first coordinates, the second coordinates, the third coordinates, and the fourth coordinates in the XY plane coordinates. The first coordinates (X1, Y1) are $(0.05, 6.5 \times 10^{-4})$.

The second coordinates (X2, Y2) are (0.05, 4.5×10$^{-3}$). The third coordinates (X3, Y3) are (0.22, 1.2×10$^{-2}$). The fourth coordinates (X4, Y4) are (0.22, 1.3×10$^{-1}$).

For example, the flow rate of the carrier gas (hydrogen) supplied to reaction chamber 201 is adjusted to be 100 slm using carrier gas flow rate controller 244. The flow rate of the second gas (silane gas) supplied to reaction chamber 201 is adjusted to be 150 sccm using second gas flow rate controller 242. The flow rate of the third gas (ammonia gas) is adjusted to be 1.1×10$^{-2}$ sccm using third gas flow rate controller 243. In this case, the value representing, in percentage, the value obtained by dividing the flow rate of the silane by the flow rate of the hydrogen is 0.15%. Therefore, the value (first value) representing, in percentage, the value obtained by dividing the flow rate of the silane by the flow rate of the hydrogen and the value (second value) representing the flow rate of the ammonia in sccm fall within the region indicated by the hatching in FIG. 2.

The flow rate (sccm) of the ammonia may be more than or equal to 6.5×10$^{-4}$, may be more than or equal to 4.5×10$^{-3}$, may be more than or equal to 1.1×10$^{-2}$, and may be more than or equal to 1.2×10$^{-2}$. The flow rate (sccm) of the ammonia may be less than or equal to 1.3×10$^{-1}$, for example. The value (%) representing, in percentage, the value obtained by dividing the flow rate of the silane by the flow rate of the hydrogen may be more than or equal to 0.05 or may be more than or equal to 0.15. The value (%) representing, in percentage, the value obtained by dividing the flow rate of the silane by the flow rate of the hydrogen may be less than or equal to 0.22, for example. The flow rate of the silane may be more than or equal to 30 sccm and may be less than or equal to 200 sccm, for example. The flow rate of the hydrogen may be more than or equal to 80 slm and may be less than or equal to 140 slm, for example.

The growth rate of silicon carbide layer 20 may be more than or equal to 8 μm/h, may be more than or equal to 15 μm/h, may be more than or equal to 25 μm/h, or may be more than or equal to 33 μm/h. The growth rate of silicon carbide layer 20 may be less than or equal to 50 μm/h. The growth rate of silicon carbide layer 20 may be determined by the ratio of the flow rate of the hydrogen to the flow rate of the silane. Since the silane is a source material gas, the growth rate of the silicon carbide layer becomes higher as the flow rate of the silane is higher. On the other hand, since the hydrogen has a characteristic to etch silicon carbide, the growth rate of the silicon carbide layer becomes lower as the flow rate of the hydrogen is higher.

As described above, reaction chamber 201 may include: first heating region 213 above silicon carbide single crystal substrate 10; and second heating region 214 located upstream of first heating region 213. In the step of forming silicon carbide layer 20, second heating region 214 may have a temperature more than or equal to a decomposition temperature of the ammonia. Second heating region 214 may have a length of more than or equal to 60 mm in the flow direction of the mixed gas.

Figure 5:
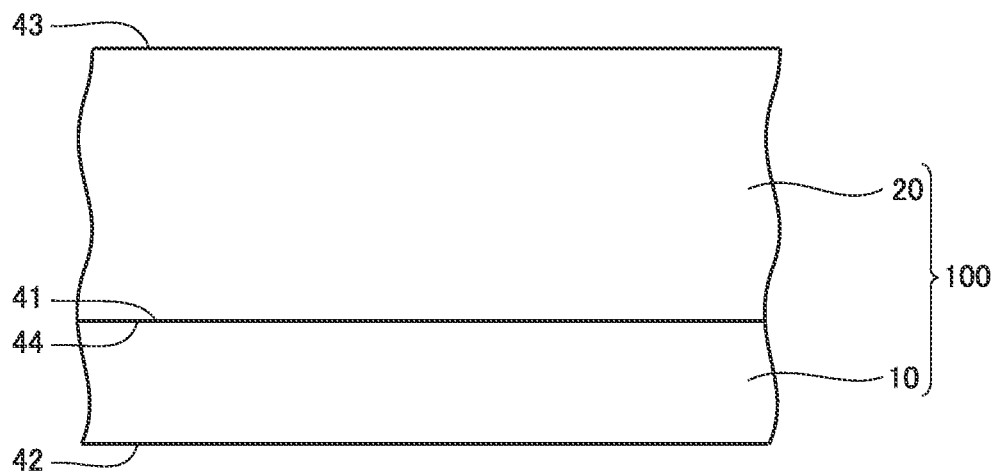
FIG. 5 is a schematic cross sectional view showing a second step of the method for manufacturing the silicon carbide epitaxial substrate according to the present embodiment.

As described above, reaction chamber 201 is supplied with the mixed gas of silane, propane, ammonia, and hydrogen, thereby forming silicon carbide layer 20 on silicon carbide single crystal substrate 10. It should be noted that methane ($CH_4$), ethane ($C_2H_6$), acetylene ($C_2H_2$), or the like may be used instead of propane. While the mixed gas is supplied to reaction chamber 201, silicon carbide single crystal substrate 10 may be rotated around rotation axis 212. In this way, silicon carbide epitaxial substrate 100 (see FIG. 5) including silicon carbide single crystal substrate 10 and silicon carbide layer 20 is manufactured. Silicon carbide layer 20 has a fourth main surface 44 in contact with silicon carbide single crystal substrate 10, and a third main surface 43 opposite to fourth main surface 44.

According to silicon carbide epitaxial substrate 100 manufactured by the above-described method, the in-plane uniformity of the carrier concentration in silicon carbide layer 20 is improved and a root mean square deviation (Sq) of the surface of silicon carbide layer 20 can be reduced while maintaining the average value of the carrier concentration of silicon carbide layer 20 to fall within a certain concentration range.

Specifically, after the step of forming silicon carbide layer 20, the average value of the carrier concentration of silicon carbide layer 20 is more than or equal to 1×10$^{15}$ cm$^{-3}$ and less than or equal to 2×10$^{16}$ cm$^{-3}$. The in-plane uniformity of the carrier concentration is less than or equal to 6%, for example. The in-plane uniformity of the carrier concentration is a representation, in percentage, of a value obtained by dividing the standard deviation of the carrier concentration by the average value of the carrier concentration. The carrier concentration may be measured by a mercury probe type C-V measuring device, for example. Specifically, one probe is placed on third main surface 43 of silicon carbide layer 20 and another probe is placed on second main surface 42 of silicon carbide single crystal substrate 10. The area of the one probe is 0.01 cm$^2$, for example. Voltage is applied between the one probe and the other probe, and a capacitance between the one probe and the other probe is measured. When the vertical axis indicates 1/C$^2$ (reciprocal of the square of the capacitance) and the horizontal axis indicates V (voltage), the carrier concentration is found based on the inclination of the straight line of the measurement data. A depth of measurement for the carrier concentration is adjusted in accordance with applied voltage. In the present embodiment, the carrier concentration is measured in a region of silicon carbide layer 20 within about 10 μm from third main surface 43 toward second main surface 42.

The root mean square deviation (Sq) of third main surface 43 is less than or equal to 0.4 nm, for example. The root mean square deviation (Sq) is a parameter obtained by extending the root mean square roughness (Rq) to three dimensions. The root mean square deviation (Sq) can be measured by a white light interferometric microscope, for example. A region for which the root mean square deviation (Sq) is measured can be a square region having each side of 250 μm.

(Method for Manufacturing Silicon Carbide Semiconductor Device)

The following describes a method for manufacturing a silicon carbide semiconductor device 300 according to the present embodiment.

Figure 6:
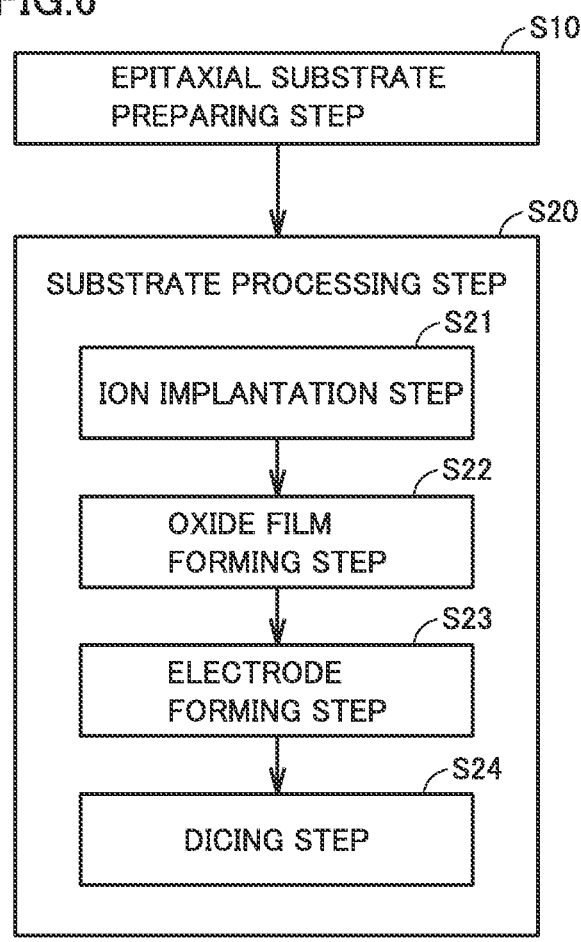
FIG. 6 is a flowchart schematically showing a method for manufacturing a silicon carbide semiconductor device according to the present embodiment.

The method for manufacturing the silicon carbide semiconductor device according to the present embodiment mainly includes an epitaxial substrate preparing step (S10: FIG. 6) and a substrate processing step (S20: FIG. 6).

First, the epitaxial substrate preparing step (S10: FIG. 6) is performed. Specifically, silicon carbide epitaxial substrate 100 is prepared by the above-described method for manufacturing the silicon carbide epitaxial substrate (see FIG. 5).

Next, the substrate processing step (S20: FIG. 6) is performed. Specifically, the silicon carbide semiconductor device is manufactured by processing the silicon carbide epitaxial substrate. The term "process" herein includes various types of processes such as ion implantation, heat treatment, etching, oxide film formation, electrode formation, and dicing. That is, the substrate processing step may include at least one process from the ion implantation, the heat treatment, the etching, the oxide film formation, the electrode formation, and the dicing.

The following describes a method for manufacturing a MOSFET (Metal Oxide Semiconductor Field Effect Transistor) as an exemplary silicon carbide semiconductor device. The substrate processing step (S20: FIG. 6) includes an ion implantation step (S21: FIG. 6), an oxide film forming step (S22: FIG. 6), an electrode forming step (S23: FIG. 6), and a dicing step (S24: FIG. 6).

Figure 7:
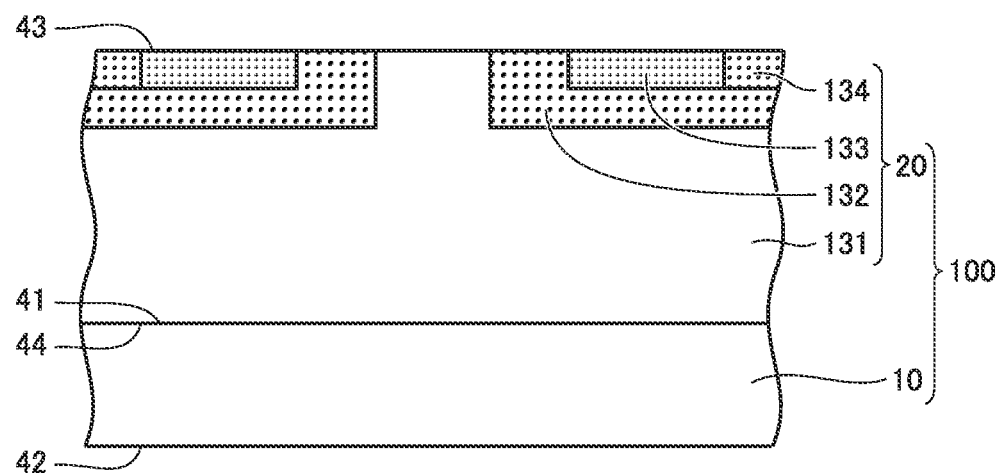
FIG. 7 is a schematic cross sectional view showing a first step of the method for manufacturing the silicon carbide semiconductor device according to the present embodiment.

First, the ion implantation step (S21: FIG. 6) is performed. For example, a p type impurity such as aluminum (Al) is implanted into third main surface 43 on which a mask (not shown) provided with an opening is formed. Accordingly, a body region 132 having p type conductivity is formed. Next, an n type impurity such as phosphorus (P) is implanted into a predetermined position in body region 132, for example. Accordingly, a source region 133 having the n type conductivity is formed. Next, a p type impurity such as aluminum is implanted into a predetermined position in source region 133. Accordingly, a contact region 134 having the p type conductivity is formed (see FIG. 7).

In silicon carbide layer 20, a portion other than body region 132, source region 133, and contact region 134 serves as a drift region 131. Source region 133 is separated from drift region 131 by body region 132. The ion implantation may be performed with silicon carbide epitaxial substrate 100 being heated at about more than or equal to 300° C. and about less than or equal to 600° C. After the ion implantation, activation annealing is performed to silicon carbide epitaxial substrate 100. With the activation annealing, the impurities implanted in silicon carbide layer 20 are activated, thereby generating carriers in each region. The activation annealing may be performed under an argon (Ar) atmosphere, for example. The temperature of the activation annealing may be about 1800° C., for example. The time of the activation annealing may be about 30 minutes, for example.

Figure 8:
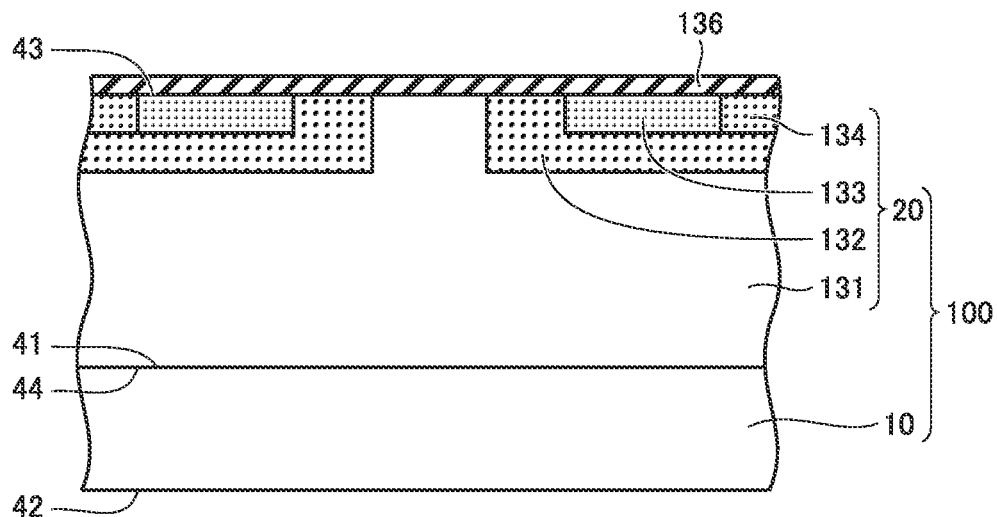
FIG. 8 is a schematic cross sectional view showing a second step of the method for manufacturing the silicon carbide semiconductor device according to the present embodiment.

Next, the oxide film forming step (S22: FIG. 6) is performed. For example, by heating silicon carbide epitaxial substrate 100 in an atmosphere including oxygen, oxide film 136 is formed on third main surface 43 (see FIG. 8). Oxide film 136 is composed of silicon dioxide ($SiO_2$) or the like, for example. Oxide film 136 functions as a gate insulating film. The temperature of the thermal oxidation process may be about 1300° C., for example. The time of the thermal oxidation process may be about 30 minutes, for example.

After forming oxide film 136, heat treatment may be further performed in a nitrogen atmosphere. For example, heat treatment may be performed at about 1100° C. for about 1 hour in an atmosphere such as nitrogen monoxide (NO), nitrous oxide ($N_2O$), or the like. Further, heat treatment may be thereafter performed in an argon atmosphere. For example, the heat treatment may be performed at about 1100 to 1500° C. in an argon atmosphere for about 1 hour.

Next, the electrode forming step (S23: FIG. 6) is performed. A first electrode 141 is formed on oxide film 136. First electrode 141 functions as a gate electrode. First electrode 141 is formed by the CVD method, for example. First electrode 141 is composed of a polysilicon or the like that contains an impurity and has conductivity, for example. First electrode 141 is formed at a position facing source region 133 and body region 132.

Next, an interlayer insulating film 137 is formed to cover first electrode 141. Interlayer insulating film 137 is formed by the CVD method, for example. Interlayer insulating film 137 is composed of silicon dioxide or the like, for example. Interlayer insulating film 137 is formed in contact with first electrode 141 and oxide film 136. Next, oxide film 136 and interlayer insulating film 137 at a predetermined position are removed by etching. Accordingly, source region 133 and contact region 134 are exposed from oxide film 136.

For example, a second electrode 142 is formed on the exposed portion by a sputtering method. Second electrode 142 functions as a source electrode. Second electrode 142 is composed of titanium, aluminum, silicon, or the like, for example. After second electrode 142 is formed, second electrode 142 and silicon carbide epitaxial substrate 100 are heated at a temperature of about 900 to 1100° C., for example. Accordingly, second electrode 142 and silicon carbide epitaxial substrate 100 are brought into ohmic contact with each other. Next, an interconnection layer 138 is formed in contact with second electrode 142. Interconnection layer 138 is composed of a material including aluminum, for example.

Next, a third electrode 143 is formed on second main surface 42. Third electrode 143 functions as a drain electrode. Third electrode 143 is composed of an alloy (for example, NiSi or the like) including nickel and silicon, for example.

Figure 9:
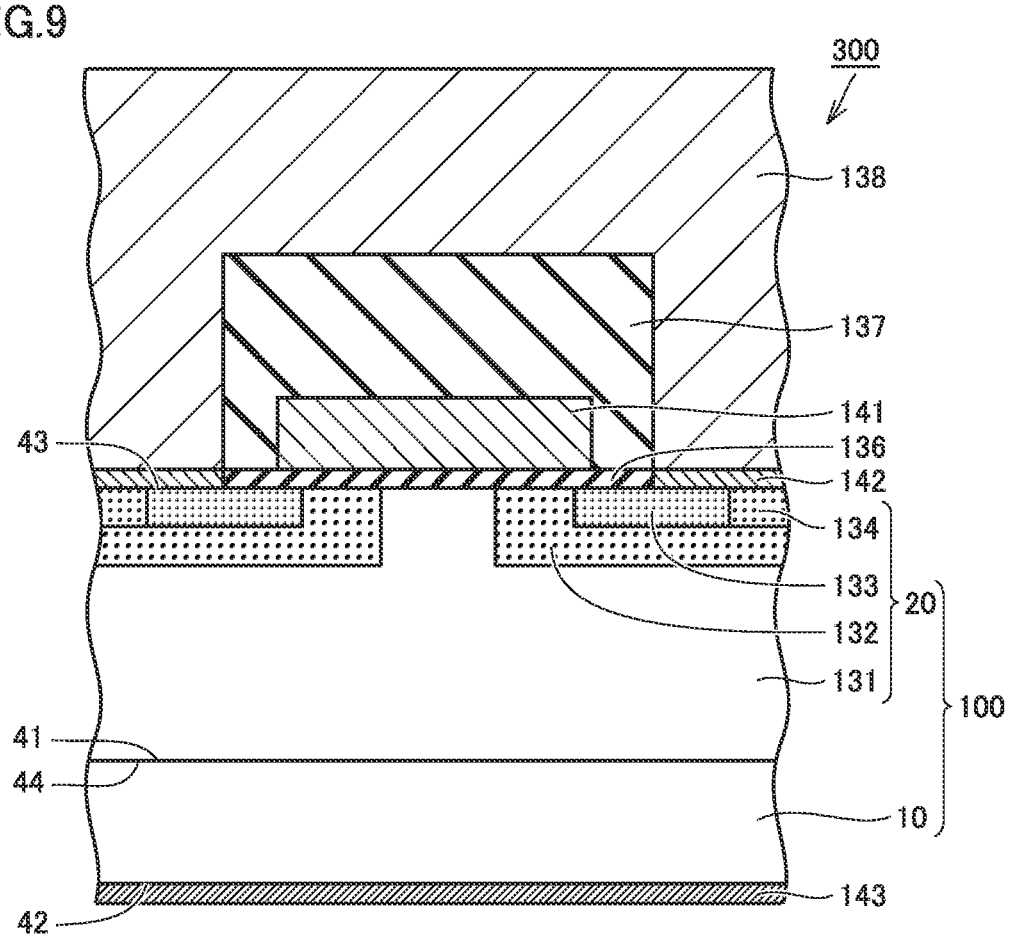
FIG. 9 is a schematic cross sectional view showing a third step of the method for manufacturing the silicon carbide semiconductor device according to the present embodiment.

Next, the dicing step (S24: FIG. 6) is performed. For example, silicon carbide epitaxial substrate 100 is diced along a dicing line, thereby dividing silicon carbide epitaxial substrate 100 into a plurality of semiconductor chips. In this way, silicon carbide semiconductor device 300 is manufactured (see FIG. 9).

In the description above, the MOSFET has been exemplified in describing the method for manufacturing the silicon carbide semiconductor device according to the present disclosure; however, the manufacturing method according to the present disclosure is not limited to this. The manufacturing method according to the present disclosure is applicable to various silicon carbide semiconductor devices such as an IGBT (Insulated Gate Bipolar Transistor), an SBD (Schottky Barrier Diode), a thyristor, a GTO (Gate Turn Off thyristor), and a PiN diode.

(Evaluation)
(Preparation of Samples)

The above-described method for manufacturing the silicon carbide epitaxial substrate was used to manufacture silicon carbide epitaxial substrates according to samples 1 to 9. In the process of manufacturing the silicon carbide epitaxial substrate according to sample 1, the $SiH_4$ flow rate/$H_2$ flow rate was 0.05%, the $NH_3$ flow rate was $6.5 \times 10^{-4} \pm 20\%$ (sccm), and the growth rate of the silicon carbide layer was 8 μm/h. In the process of manufacturing the silicon carbide epitaxial substrate according to sample 2, the $SiH_4$ flow rate/$H_2$ flow rate was 0.05%, the $NH_3$ flow rate was $4.5 \times 10^{-3} \pm 20\%$ (sccm), and the growth rate of the silicon carbide layer was 8 μm/h. In the process of manufacturing the silicon carbide epitaxial substrate according to sample 3, the $SiH_4$ flow rate/$H_2$ flow rate was 0.22%, the $NH_3$ flow rate was $1.2 \times 10^{-2} \pm 20\%$ (sccm), and the growth rate of the silicon carbide layer was 50 μm/h. In the process of manufacturing the silicon carbide epitaxial substrate according to sample 4, the $SiH_4$ flow rate/$H_2$ flow rate was 0.22%, the $NH_3$ flow rate was $1.3 \times 10^{-1} \pm 20\%$ (sccm), and the growth rate of the silicon carbide layer was 50 μm/h. In the process of manufacturing the silicon carbide epitaxial substrate according to sample 5, the $SiH_4$ flow rate/$H_2$ flow rate was 0.15%, the $NH_3$ flow rate was $1.1 \times 10^{-2} \pm 20\%$ (sccm), and the growth rate of the silicon carbide layer was 33 μm/h.

In the process of manufacturing the silicon carbide epitaxial substrate according to sample 6, the $SiH_4$ flow rate/$H_2$ flow rate was 0.03%, the $NH_3$ flow rate was $8 \times 10^{-4} \pm 20\%$ (sccm), and the growth rate of the silicon carbide layer was about 2 μm/h. In the process of manufacturing the silicon carbide epitaxial substrate according to sample 7, the SiH$_4$ flow rate/H$_2$ flow rate was 0.37%, the NH$_3$ flow rate was 7×10$^{-2}$±20% (sccm), the growth rate of the silicon carbide layer was 90 μm/h. In the process of manufacturing the silicon carbide epitaxial substrate according to sample 8, the SiH$_4$ flow rate/H$_2$ flow rate was 0.12%, the NH$_3$ flow rate was 9×10$^{-2}$±20% (sccm), and the growth rate of the silicon carbide layer was 25 μm/h. In the process of manufacturing the silicon carbide epitaxial substrate according to sample 9, the SiH$_4$ flow rate/H$_2$ flow rate was 0.12%, the NH$_3$ flow rate was 1×10$^{-3}$±20% (sccm), and the growth rate of the silicon carbide layer was 25 μm/h. In the method for manufacturing each of the silicon carbide epitaxial substrates according to samples 1 to 9, the H$_2$ flow rate was set at 120 slm and the SiH$_4$ flow rate was changed, thereby changing the SiH$_4$ flow rate/H$_2$ flow rate.

(Measurement)

The carrier concentration of silicon carbide layer 20 of silicon carbide epitaxial substrate 100 according to each of samples 1 to 9 was measured using a mercury probe type C-V measuring device. The carrier concentration was measured in a region within a radius of 60 mm from the center of third main surface 43. The carrier concentration was measured at a plurality of positions located at a substantially equal interval on a straight line passing through the center of third main surface 43 and parallel to the radial direction, and on a straight line perpendicular to the foregoing straight line. Specifically, the carrier concentration was measured at the following positions: the center of third main surface 43; and positions away from the center in the radial direction by 10 mm, 20 mm, 30 mm, 40 mm, 50 mm and 60 mm. A total of the positions of measurement for the carrier concentration are 25. The in-plane uniformity of the carrier concentration was calculated by dividing the standard deviation of the carrier concentration by the average value of the carrier concentration. It should be noted that the area of the probe at the mercury side is 0.01 cm$^2$, for example.

The root mean square deviation (Sq) in the central region of third main surface 43 was measured using a white light interferometric microscope. A region for which the root mean square deviation was measured is a square region having each side of 250 μm. The root mean square deviation was measured at the following positions: the center of third main surface 43; and a position away from the center by 50 mm in the radial direction. A total of the positions for measurement of the root mean square deviation are 2. A range of Sq is shown in Table 1.

(Result)

FIG. 10 is a plot on an XY plane coordinates, where the X axis indicates SiH$_4$/H$_2$ and the Y axis indicates NH$_3$ in the process of manufacturing the silicon carbide epitaxial substrate according to each of samples 1 to 9. Coordinates 101 to 109 respectively correspond to the methods for manufacturing the silicon carbide epitaxial substrates according to samples 1 to 9.

TABLE 1

|  | Sample 1 | Sample 2 | Sample 3 | Sample 4 | Sample 5 | Sample 6 | Sample 7 | Sample 8 | Sample 9 |
|---|---|---|---|---|---|---|---|---|---|
| SiH$_4$/H$_2$ (%) | 0.05 | 0.05 | 0.22 | 0.22 | 0.15 | 0.03 | 0.37 | 0.12 | 0.12 |
| NH$_3$ (sccm) | 6.5 × 10$^{-4}$ ±20% | 4.5 × 10$^{-3}$ ±20% | 1.2 × 10$^{-2}$ ±20% | 0.13 ±20% | 1.1 × 10$^{-2}$ ±20% | 8 × 10$^{-4}$ ±20% | 0.07 ±20% | 0.09 ±20% | 1 × 10$^{-3}$ ±20% |
| Carrier Concentration Uniformity sigma/average (%) | <6 | <6 | <3 | <3 | <2 | to 7 | <3 | <2 | <6 |
| Growth Rate (μm/h) | 8 | 8 | 50 | 50 | 33 | to 2 | 90 | 25 | 25 |
| Sq@250 μm Angle (nm) | 0.1 to 0.4 | 0.1 to 0.4 | 0.1 to 0.4 | 0.1 to 0.4 | 0.1 to 0.4 | 0.1 to 0.4 | >0.8 | 0.1 to 0.4 | 0.1 to 0.4 |
| Average Carrier Concentration (cm$^{-3}$) | 1 × 10$^{15}$ | 2 × 10$^{16}$ | 1 × 10$^{15}$ | 2 × 10$^{16}$ | 3 × 10$^{15}$ | 3 × 10$^{15}$ | 3 × 10$^{15}$ | >3 × 10$^{16}$ | <1 × 10$^{15}$ |

As shown in Table 1, the respective in-plane uniformities of the carrier concentrations in the silicon carbide layers of the silicon carbide epitaxial substrates according to samples 1 to 9 were less than 6%, less than 6%, less than 3%, less than 3%, less than 2%, about 7%, less than 3%, less than 2%, and less than 6%. The respective root mean square deviations (Sq) of the third surfaces of the silicon carbide layers of the silicon carbide epitaxial substrates according to samples 1 to 9 were 0.1 to 0.4 nm, 0.1 to 0.4 nm, 0.1 to 0.4 nm, 0.1 to 0.4 nm, 0.1 to 0.4 nm, 0.1 to 0.4 nm, more than 0.8 nm, 0.1 to 0.4 nm, and 0.1 to 0.4 nm. The respective average carrier concentrations in the silicon carbide layers of the silicon carbide epitaxial substrates according to samples 1 to 9 were 1×10$^{15}$ cm$^{-3}$, 2×10$^{16}$ cm$^{-3}$, 1×10$^{15}$ cm$^{-3}$, 2×10$^{16}$ cm$^{-3}$, 3×10$^{15}$ cm$^{-3}$, 3×10$^{15}$ cm$^{-3}$, 3×10$^{15}$ cm$^{-3}$, more than 3×10$^{16}$ cm$^{-3}$, and less than 1×10$^{15}$ cm$^{-3}$.

As shown in Table 1, in each of the silicon carbide epitaxial substrates according to samples 1 to 5, the average carrier concentration was more than or equal to 1×10$^{15}$ cm$^{-3}$ and less than or equal to 2×10$^{16}$ cm$^{-3}$, the value of the carrier concentration uniformity was less than or equal to 6%, the growth rate was more than or equal to 8 μm/h, and the root mean square deviation (Sq) was less than or equal to 0.4 nm. Under the manufacturing conditions for the silicon carbide epitaxial substrate according to sample 6, the growth rate was 2 μm/h, thus failing to achieve high-rate growth. Moreover, in the silicon carbide epitaxial substrate according to sample 6, the value of the in-plane uniformity of the carrier concentration was about 7%, and the carrier concentration was not sufficiently uniform in the plane. In the silicon carbide epitaxial substrate according to sample 7, the root mean square deviation (Sq) was more than 0.8 nm and flatness was not sufficiently high. In the silicon carbide epitaxial substrate according to sample 8, the average carrier concentration became more than 2×10$^{16}$ cm$^{-3}$, thus failing to achieve a range of the average carrier concentration required in power devices. In the silicon carbide epitaxial substrate according to sample 9, the average carrier concentration became less than $1\times10^{15}$ cm$^{-3}$, thus failing to achieve a range of the average carrier concentration required in power devices.

In view of the result above, in each of the silicon carbide epitaxial substrates according to samples 1 to 5, the excellent in-plane uniformity of the carrier concentration, the high growth rate, and the excellent flatness could be achieved while maintaining the average carrier concentration to be more than or equal to $1\times10^{15}$ cm$^{-3}$ and less than or equal to $2\times10^{16}$ cm$^{-3}$. In other words, it was proved possible to manufacture the silicon carbide epitaxial substrate having the excellent in-plane uniformity of the carrier concentration, the high growth rate, and the excellent flatness by controlling the flow rate of the silane, the flow rate of the hydrogen, and the flow rate of the ammonia in the process of manufacturing the silicon carbide epitaxial substrate such that the value (first value) representing, in percentage, the value obtained by dividing the flow rate of the silane by the flow rate of the hydrogen and the value (second value) representing the flow rate of the ammonia in sccm fall within the quadrangular region (region indicated by hatching in FIG. 2) surrounded by the first coordinates, the second coordinates, the third coordinates, and the fourth coordinates in the XY plane coordinates.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

10: silicon carbide single crystal substrate; 20: silicon carbide layer; 41: first main surface; 42: second main surface; 43: third main surface; 44: fourth main surface; 100: silicon carbide epitaxial substrate; 131: drift region; 132: body region; 133: source region; 134: contact region; 136: oxide film; 137: interlayer insulating film; 138: interconnection layer; 141: first electrode; 142: second electrode; 143: third electrode; 200: manufacturing apparatus; 201: reaction chamber; 203: heating element; 204: quartz tube; 205: heat insulator; 206: induction heating coil; 207: gas inlet; 208: gas outlet; 210: susceptor plate; 211: heater; 212: rotation axis; 213: first heating region; 214: second heating region; 221, 222: length; 231: first gas supplier; 232: second gas supplier; 233: third gas supplier; 234: carrier gas supplier; 235: gas supplier; 241: first gas flow rate controller; 242: second gas flow rate controller; 243: third gas flow rate controller; 244: carrier gas flow rate controller; 245: controller; 300: silicon carbide semiconductor device.

The invention claimed is:

1. A method for manufacturing a silicon carbide epitaxial substrate, the method comprising:
   placing a silicon carbide single crystal substrate in a reaction chamber; and
   forming a silicon carbide layer on the silicon carbide single crystal substrate by supplying the reaction chamber with a mixed gas including silane, ammonia, hydrogen, and a gas including carbon atoms,
   the silicon carbide single crystal substrate having a maximum diameter of more than or equal to 100 mm,
   in the forming of the silicon carbide layer, when an X axis indicates a first value representing, in percentage, a value obtained by dividing a flow rate of the silane by a flow rate of the hydrogen and a Y axis indicates a second value representing a flow rate of the ammonia in sccm, the first value and the second value falling within a quadrangular region surrounded by first coordinates, second coordinates, third coordinates, and fourth coordinates in XY plane coordinates,
   the first coordinates being (0.05, 6.5×10$^{-4}$),
   the second coordinates being (0.05, 4.5×10$^{-3}$),
   the third coordinates being (0.22, 1.2×10$^{-2}$),
   the fourth coordinates being (0.22, 1.3×10$^{-1}$),
   after the forming of the silicon carbide layer, an average value of carrier concentration of the silicon carbide layer being more than or equal to 1×10$^{15}$ cm$^{-3}$ and less than or equal to 2×10$^{16}$ cm$^{-3}$.

2. The method for manufacturing the silicon carbide epitaxial substrate according to claim 1, wherein
   the reaction chamber includes a first heating region above the silicon carbide
   single crystal substrate and a second heating region located upstream of the first heating region, and
   in the forming of the silicon carbide layer, the second heating region has a temperature more than or equal to a decomposition temperature of the ammonia.

3. The method for manufacturing the silicon carbide epitaxial substrate according to claim 2, wherein the second heating region has a length of more than or equal to 60 mm in a flow direction of the mixed gas.

4. A method for manufacturing a silicon carbide semiconductor device, the method comprising:
   preparing the silicon carbide epitaxial substrate manufactured by the method recited in claim 1; and
   processing the silicon carbide epitaxial substrate.

* * * * *